(12) United States Patent
Han et al.

(10) Patent No.: US 11,205,685 B2
(45) Date of Patent: Dec. 21, 2021

(54) ELECTRO-LUMINESCENT DISPLAY DEVICE AND METHOD OF FABRICATING THE SAME

(71) Applicant: LG Display Co., Ltd., Seoul (KR)

(72) Inventors: Jongsoo Han, Paju-si (KR); SangMoo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/379,985

(22) Filed: Apr. 10, 2019

(65) Prior Publication Data

US 2019/0326372 A1 Oct. 24, 2019

(30) Foreign Application Priority Data

Apr. 19, 2018 (KR) .................. 10-2018-0045752

(51) Int. Cl.
| | |
|---|---|
| *H01L 27/32* | (2006.01) |
| *H01L 51/52* | (2006.01) |
| *H01L 51/50* | (2006.01) |
| *G09G 3/3291* | (2016.01) |
| *G09G 3/3233* | (2016.01) |
| *G09G 3/3266* | (2016.01) |

(52) U.S. Cl.
CPC ....... *H01L 27/3246* (2013.01); *G09G 3/3233* (2013.01); *G09G 3/3266* (2013.01); *G09G 3/3291* (2013.01); *H01L 27/322* (2013.01); *H01L 27/3223* (2013.01); *H01L 27/3276* (2013.01); *H01L 51/504* (2013.01); *H01L 51/5206* (2013.01); *H01L 51/5278* (2013.01); *G09G 2300/0413* (2013.01); *H01L 2227/323* (2013.01); *H01L 2251/308* (2013.01)

(58) Field of Classification Search
CPC combination set(s) only.
See application file for complete search history.

(56) References Cited

U.S. PATENT DOCUMENTS

| 9,647,241 B2* | 5/2017 | Lee | H01L 27/3209 |
| 2013/0146850 A1* | 6/2013 | Pieh | H01L 51/5203 |
| | | | 257/40 |

(Continued)

FOREIGN PATENT DOCUMENTS

| CN | 101882601 A | 11/2010 |
| CN | 102655155 A | 9/2012 |

(Continued)

OTHER PUBLICATIONS

Office Action dated Jan. 15, 2020 issued in corresponding Korean Application No. 10-2018-0045752 (9 pages).

(Continued)

*Primary Examiner* — Telly D Green
(74) *Attorney, Agent, or Firm* — Polsinelli PC

(57) ABSTRACT

An electro-luminescent display device includes an anode disposed on a substrate; a bank having an opening that exposes a portion of the anode and having an undercut structure adjacent to the opening; a dummy pattern disposed at the undercut structure of the bank; an organic light-emission layer disposed on the anode and electrically disconnected with at least one of adjacent pixels; and a cathode disposed on the organic light-emission layer.

18 Claims, 13 Drawing Sheets

(56) References Cited

U.S. PATENT DOCUMENTS

| | | | | |
|---|---|---|---|---|
| 2016/0190521 | A1* | 6/2016 | Lee | H01L 27/3209 257/40 |
| 2017/0317154 | A1* | 11/2017 | Heo | H01L 27/3262 |
| 2019/0189960 | A1* | 6/2019 | Paek | H01L 51/5253 |
| 2019/0198806 | A1* | 6/2019 | Im | H01L 27/322 |
| 2019/0207163 | A1* | 7/2019 | Paek | H01L 51/5265 |

FOREIGN PATENT DOCUMENTS

| | | | | |
|---|---|---|---|---|
| CN | 102779785 | A | 11/2012 | |
| CN | 102983103 | A | 3/2013 | |
| CN | 103022366 | A | 4/2013 | |
| CN | 103779470 | A | 5/2014 | |
| CN | 104752489 | A | 7/2015 | |
| CN | 104795407 | A | 7/2015 | |
| CN | 106252217 | A | 12/2016 | |
| JP | 2014-082132 | A | 5/2014 | |
| KR | 20040073986 | A | 8/2004 | |
| KR | 10-2007-0003133 | A | 1/2007 | |
| KR | 20070003133 | A * | 1/2007 | |
| KR | 10-2007-0118425 | A | 12/2007 | |
| KR | 10-2008-0086201 | A | 9/2008 | |
| KR | 10-2009-0002717 | A | 1/2009 | |
| KR | 10-2014-0079120 | A | 6/2014 | |
| KR | 20140084603 | A * | 7/2014 | H01L 51/50 |
| KR | 10-2015-0033345 | A | 4/2015 | |
| KR | 10-2015-0141338 | A | 12/2015 | |
| KR | 20160016339 | A | 2/2016 | |
| KR | 20160016339 | A * | 2/2016 | H01L 51/5228 |
| KR | 20170015829 | A * | 2/2017 | H01L 27/3246 |
| KR | 20170015829 | A | 2/2017 | |
| KR | 10-2017-0034173 | A | 3/2017 | |
| KR | 20170076184 | A | 7/2017 | |
| KR | 20170139957 | A | 12/2017 | |

OTHER PUBLICATIONS

KR Office Action issued in co-pending Korean Patent Application No. 2018-0045752 dated Jul. 10, 2019.
Korean Office Action dated Dec. 16, 2020 issued in Patent Application No. 10-2018-0045752 (6 pages).
Chinese Office Action dated Apr. 1, 2021 issued in corresponding Patent Application No. 201910308590.7 w/English Translation (21 pages).
Korean Notice of Allowance dated Apr. 27, 2021 issued in corresponding Patent Application No. 10-2018-0045752 (5 pages).
Chinese Office Action dated Oct. 12, 2021 issued in corresponding Patent Application No. 201910308590.7 w/English Translation (24 pages).

* cited by examiner

ELECTRO-LUMINESCENT DISPLAY DEVICE AND METHOD OF FABRICATING THE SAME

CROSS-REFERENCE TO RELATED APPLICATION

This application claims the priority of Korean Patent Application No. 10-2018-0045752 filed on Apr. 19, 2018 in the Korean Intellectual Property Office, which is incorporated herein by reference in its entirety.

BACKGROUND

Field of the Disclosure

The present disclosure relates to a display device, and more particularly, an electro-luminescent display device and a method of fabricating the same. Although the present disclosure is suitable for a wide scope of applications, it is particularly suitable for suppressing the occurrence of light emission defects caused by the increased amount of lithium (Li) in an organic light-emission layer of the electro-luminescent display device.

Description of the Background

As the information age advances, the field of display devices for visually displaying electrical information signals has grown rapidly. Accordingly, various studies on display devices are ongoing to improve various aspects in thin profile, light weight, and low power consumption.

Representative examples of the display devices include a liquid crystal display device (LCD), a field emission display device (FED), an electro-wetting display device (EWD), and an organic light emitting display device (OLED).

Particularly, electro-luminescent display devices including the OLED are self-light emitting display devices and do not need a separate light source unlike the LCD. Thus, the electro-luminescent display devices can be manufactured into a lightweight and thin profile. Further, the electro-luminescent display devices are advantageous in terms of power consumption since they are driven with a low voltage. Also, the electro-luminescent display devices have excellent color expression ability, a high response speed, a wide viewing angle, and a high contrast ratio (CR). Therefore, the electro-luminescent display devices are expected to be applied in various fields.

An electro-luminescent display device includes a light-emission layer formed of an organic material between two electrodes known as an anode and a cathode. When a hole from the anode and an electron from the cathode are injected into the light-emission layer, the injected hole and electron recombine into an exciton to emit light from the light-emission layer.

The light-emission layer contains a host material and a dopant material, and these two materials interact with each other. The host generates an exciton from an electron and a hole and transfers energy to the dopant. The dopant is an organic dye material contained in a small amount and receives the energy from the host and converts the energy into light.

SUMMARY

Accordingly, the present disclosure is directed to an electro-luminescent display device with an improved contact structure that substantially obviates one or more of problems due to limitations and disadvantages of the prior art.

Lithium (Li) has been used for forming an organic light-emission layer of an electro-luminescent display device. The excessive use of Li can increase the life span of an organic light emitting device. However, the high conductivity properties of Li can cause a current to be transferred to a neighboring pixel and thus cause a light emission defect of the neighboring pixel.

The inventors of the present disclosure perceived that an organic light-emission layer deposited on the entire surface of a substrate, pixels defined by a bank, and an undercut structure formed under an edge of the bank can cut off an inter-pixel connection of the organic light-emission layer deposited on the entire surface of the substrate. Then, the inventors of the present disclosure formed the undercut structure under the edge of the bank with a dummy pattern which can be selectively etched relative to an anode. Thus, the inventors of the present disclosure invented a structure capable of suppressing the occurrence of a light emission defect caused by an increase of Li.

Accordingly, the present disclosure is to provide an electro-luminescent display device and a method of fabricating the same by which it is possible to solve a light emission defect of a neighboring pixel caused by an increase of Li in an organic light-emission layer.

Further, the present disclosure is to provide an electro-luminescent display device and a method of fabricating the same by which it is possible to form the above-described undercut structure without an increase of masks.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

To achieve these and other advantages and in accordance with the present disclosure, as embodied and broadly described, an electro-luminescent display device includes an anode disposed on a substrate; a bank having an opening that exposes a portion of the anode and having an undercut structure adjacent to the opening; a dummy pattern disposed at the undercut structure of the bank; an organic light-emission layer disposed on the anode and electrically disconnected with at least one of adjacent pixels; and a cathode disposed on the organic light-emission layer.

In another aspect of the present disclosure, an electro-luminescent display device includes an anode disposed on a substrate; a bank having an opening that exposes a portion of the anode and having an undercut structure adjacent to the opening; a dummy pattern disposed at the undercut structure of the bank; an organic light-emission layer disposed on the anode, wherein the organic light-emission layer is electrically disconnected with adjacent pixels and movement of lithium in the organic light-emission layer to the adjacent pixels is suppressed; and a cathode disposed on the organic light-emission layer.

In yet another aspect of the present disclosure, a method of fabricating an electro-luminescent display device includes forming a first metal layer and a second metal layer on a substrate. The method further includes forming a photoresist pattern on the substrate. The method also includes forming an anode and a second metal layer pattern by etching the first and second metal layers using the photoresist pattern as a mask. The method further includes ashing the photoresist pattern and forming a first dummy pattern by etching the second metal layer pattern using the ashed photoresist pattern as a mask. The method also includes forming a bank on the substrate to expose one side of the first dummy pattern. The method further includes forming a dummy pattern under an edge of the bank to form an undercut structure within the bank by etching the first dummy pattern. The method also includes forming an organic light-emission layer and a cathode on the substrate. A connection of the organic light-emission layer between neighboring pixels may be cut off by the dummy pattern.

According to the present disclosure, an undercut structure is formed under an edge of a bank to cut off an inter-pixel connection of an organic light-emission layer. Thus, it is possible to solve a light emission defect of a neighboring pixel caused by the excessive use of Li. Also, it is possible to increase the life span of an electro-luminescent display device due to an increase of Li.

According to the present disclosure, a dummy pattern which can be selectively etched relative to an anode is used to form the undercut structure under the edge of the bank without adding a mask. Thus, it is possible to reduce manufacturing cost and manufacturing processes.

The effects according to the present disclosure are not limited to the contents exemplified above, and more various effects are included in the present specification.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
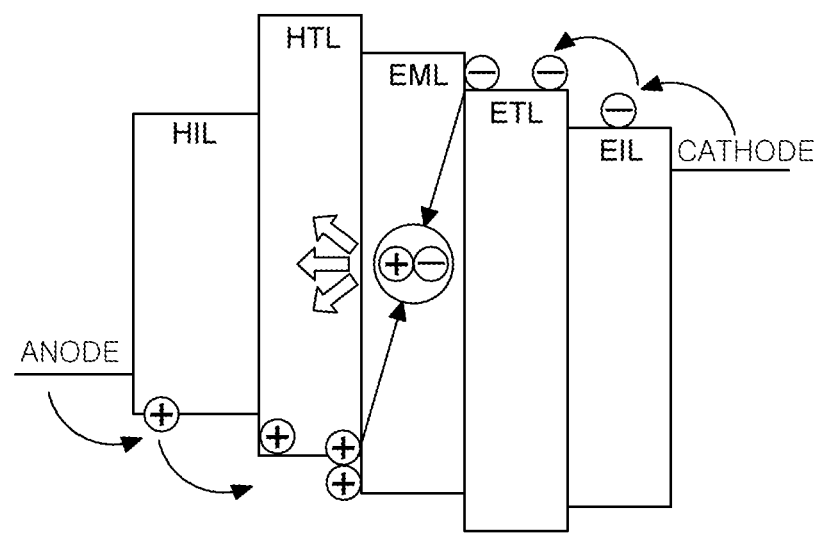
FIG. 1 schematically illustrates a structure of an organic light emitting diode.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various aspects of the present disclosure will be described in detail with reference to the accompanying drawings.

FIG. 1 schematically illustrates a structure of an organic light emitting diode.

An electro-luminescent display device which is one of display devices including an organic light emitting display device has an organic light emitting diode as shown in FIG. 1.

Referring to FIG. 1, the organic light emitting diode may include organic compound layers HIL, HTL, EML, ETL, and EIL between an anode and a cathode.

The organic compound layers HIL, HTL, EML, ETL, and EIL may include a hole injection layer HIL, a hole transport layer HTL, an emission layer EML, an electron transport layer ETL, and an electron injection layer EIL.

When a driving voltage is applied to the anode and the cathode, a hole passing through the hole transport layer HTL and an electron passing through the electron transport layer ETL move to the emission layer EML to combine into an exciton. Hence, the emission layer EML emits visible light.

The electro-luminescent display device is provided with pixels including the organic light emitting diode in a matrix form and controls the brightness of pixels selected by a scan pulse depending on a gray level of digital video data.

The electro-luminescent display device may be classified into a passive matrix type or an active matrix type using a thin film transistor (TFT) as a switching device depending on a driving method.

In the active matrix type electro-luminescent display device, the TFT used as an active element is selectively turned on to select a pixel and light emission of the pixel is maintained with a voltage maintained in a storage capacitor.

Figure 2:
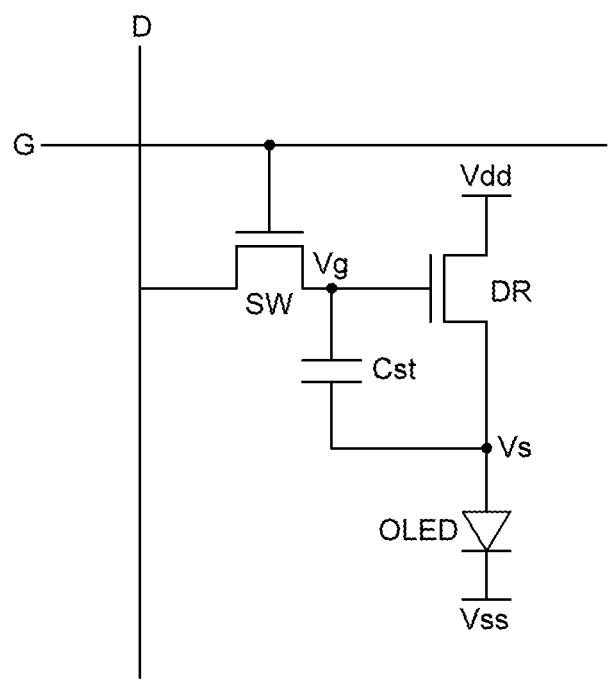
FIG. 2 is a circuit diagram equivalently representing a pixel in an electro-luminescent display device according to an aspect of the present disclosure.

FIG. 2 is a circuit diagram equivalently representing a pixel in an electro-luminescent display device according to an aspect of the present disclosure.

Referring to FIG. 2, in an electro-luminescent display device according to an aspect of the present disclosure, a pixel may include an organic light emitting diode OLED and a data line D and a gate line G that intersect each other to define a pixel region. The pixel may further include a scan switch (i.e., switching transistor) SW to sequentially transfer data to the pixel in response to a scan pulse from the gate line G. The pixel may also include a driving switch (i.e., drive transistor) DR to generate a current with a voltage between gate and source terminals and a storage capacitor Cst to store data and retain the data for a certain period of time.

The scan switch SW and the drive switch DR may be an N-type metal-oxide semiconductor field effect transistor (MOS-FET). However, the present disclosure is not limited thereto.

The structure including the two transistors SW and DR and the single capacitor Cst may be referred to as a 2T-1C structure.

The scan switch SW is turned on in response to a scan pulse from the gate line G, and, thus, a current path between a source electrode and a drain electrode of the scan switch SW can be turned on.

Further, during on-time of the scan switch SW, a data voltage from the data line DL may be applied to a gate electrode of the drive switch DR and the storage capacitor Cst via the source electrode and the drain electrode of the scan switch SW.

The drive switch DR may control a current flowing in the organic light emitting diode OLED depending on a voltage Vgs between the gate electrode and a source electrode of the drive switch DR.

The storage capacitor Cst may store the data voltage applied to an electrode at one end of the storage capacitor Cst to maintain a voltage supplied to the gate electrode of the drive switch DR constant during a frame period.

The organic light emitting diode OLED configured as illustrated in FIG. 1 may be connected between the source electrode of the drive switch DR and a low-potential driving voltage source VSS.

The current flowing in the organic light emitting diode OLED is proportional to the brightness of the pixel and can be determined by a voltage between the gate and source electrodes of the drive switch DR.

Figure 3:
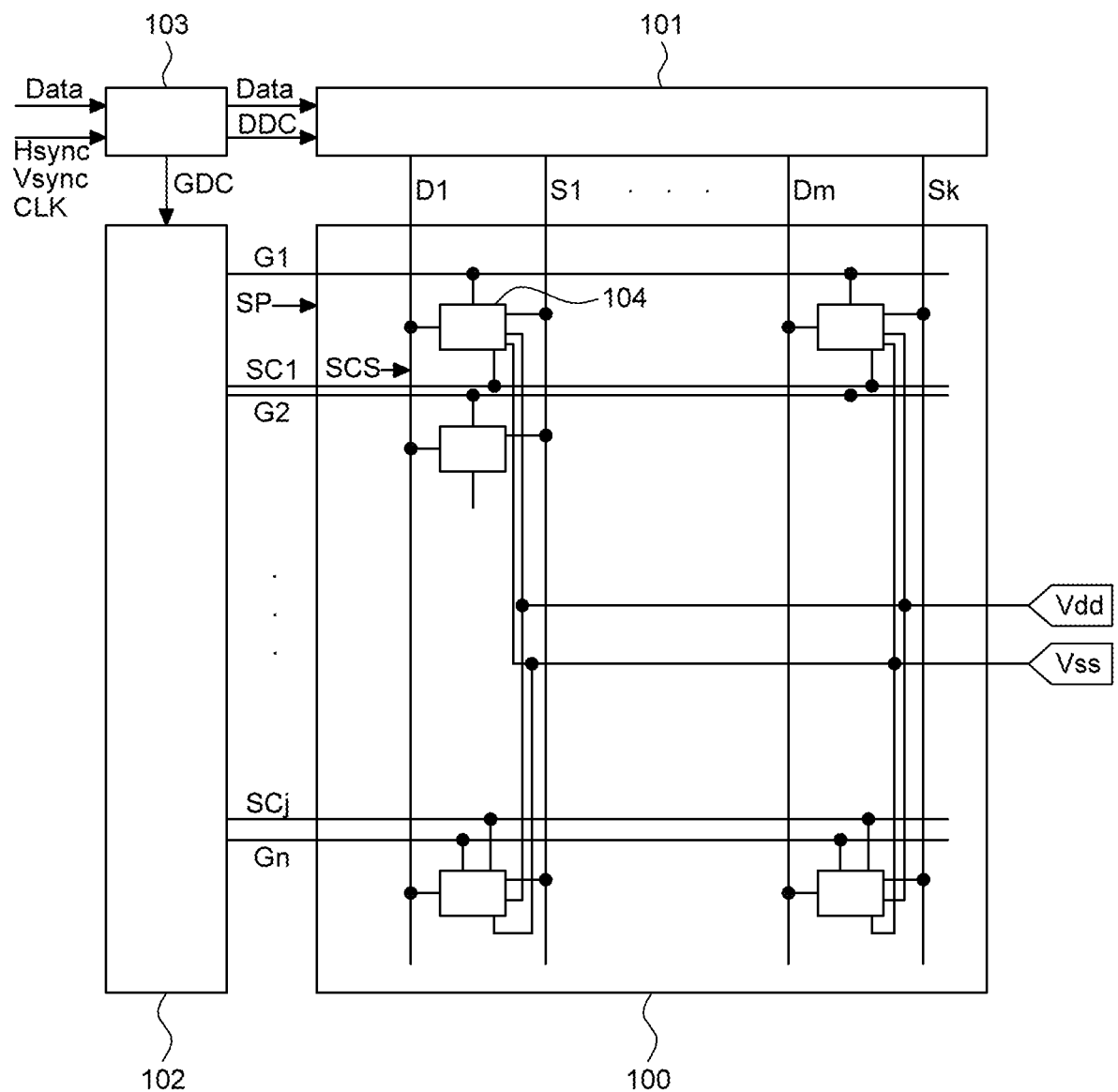
FIG. 3 is a block diagram schematically illustrating the electro-luminescent display device according to an aspect of the present disclosure.

FIG. 3 is a block diagram schematically illustrating the electro-luminescent display device according to an aspect of the present disclosure.

Referring to FIG. 3, the electro-luminescent display device according to an aspect of the present disclosure may include a display panel 100, a gate drive circuit 102, a data drive circuit 101, and a timing controller 103.

The display panel 100 may include m×n number of pixels 104 at respective intersections of m number of data lines D1 to Dm in one-to-one correspondence to form m number of pairs, k number of sensing lines S1 to Sk, n number of gate lines G1 to Gn, and j number of sensing control lines SC1 to SCj.

Signal lines for supplying a first driving power Vdd and signal lines for supplying a second driving power Vss to each pixel 104 may be formed on the display panel 100. The first driving power Vdd and the second driving power Vss may be generated from a high-potential driving voltage source VDD and the low-potential driving voltage source VSS, respectively.

The gate drive circuit 102 may generate a scan pulse SP in response to a gate control signal GDC from the timing controller 103 and sequentially supply the scan pulse SP to the gate lines G1 to Gn.

Further, the gate drive circuit 102 may output a sensing control signal SCS under the control of the timing controller 103, and a sensing switch in each pixel 104 can be controlled by the sensing control signal SCS.

Herein, it has been described that the gate drive circuit 102 outputs both the scan pulse SP and the sensing control signal SCS, but the present disclosure is not limited thereto. A separate sensing switch control driver capable of outputting the sensing control signal SCS under the control of the timing controller 103 may be provided.

The data drive circuit 101 may be controlled by a data control signal DDC from the timing controller 103 and may output a data voltage to the data lines D1 to Dm and a sensing voltage to the sensing lines S1 to Sk.

The data lines D1 to Dm are connected to the respective pixels 104 to apply the data voltage to the respective pixels 104.

The sensing lines S1 to Sk are connected to the respective pixels 104 to supply the sensing voltage to the respective pixels 104 and measure sensing voltages of the sensing lines S1 to Sk. Specifically, sensing voltages can be detected by charging an initialization voltage into the pixels 104 through the respective sensing lines S1 to Sk and setting the pixels 104 in a floating state.

Herein, it has been described that the data drive circuit 101 can output or detect the data voltage and the sensing voltage, but the present disclosure is not limited thereto. A separate driver capable of outputting or detecting the sensing voltage may be provided.

Figure 4:
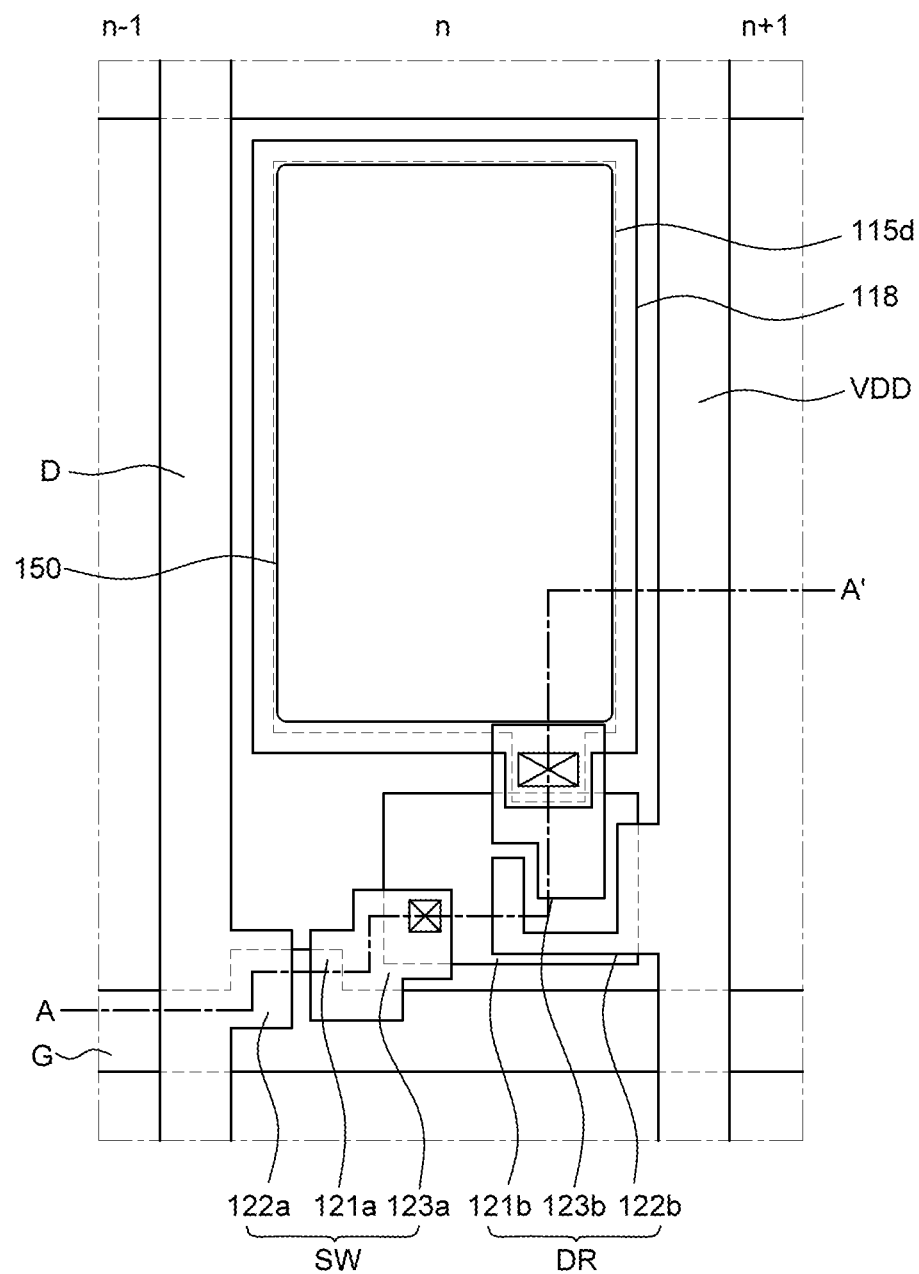
FIG. 4 is a plan diagram schematically illustrating the electro-luminescent display device according to an aspect of the present disclosure.
Figure 5:
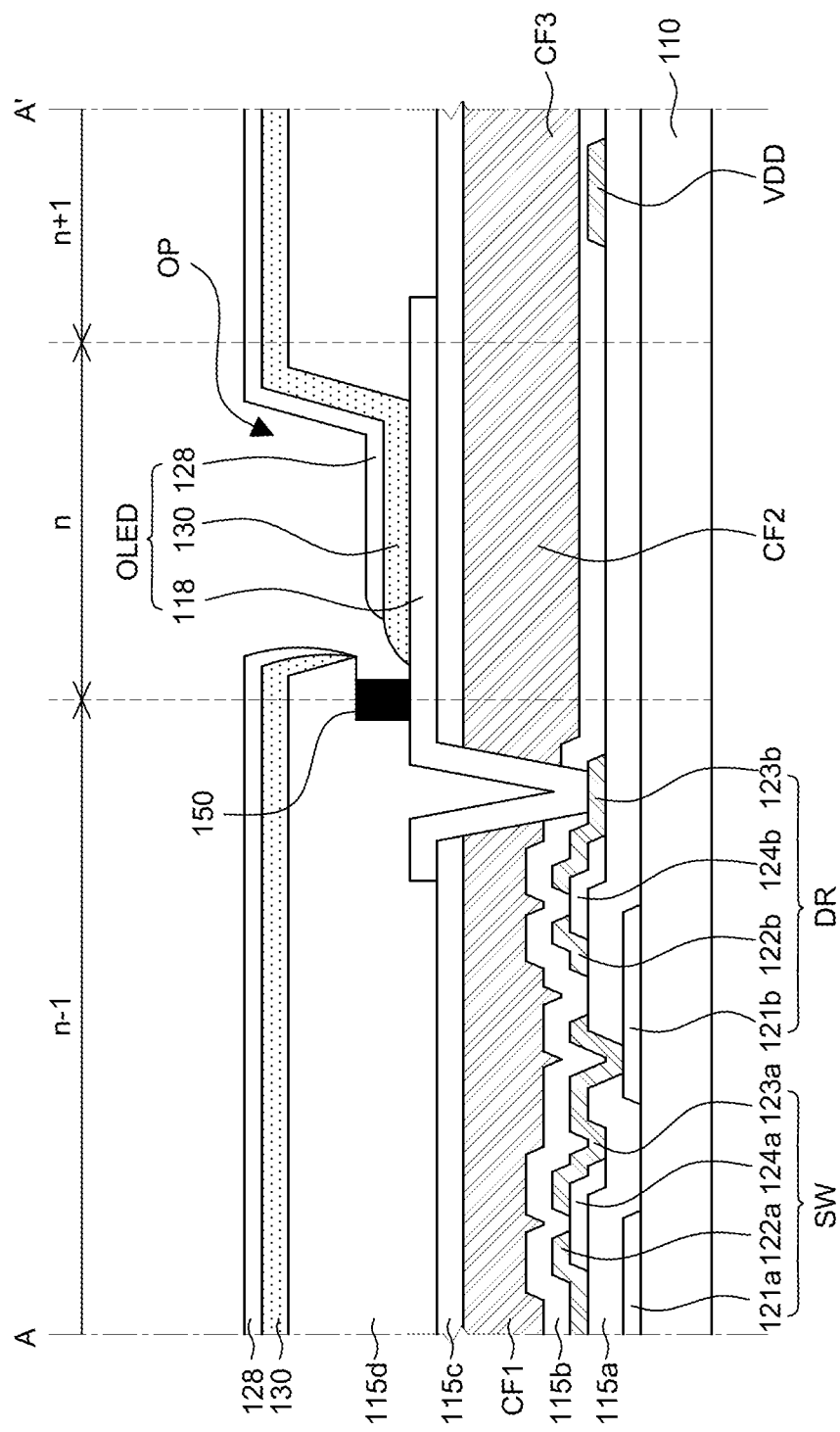
FIG. 5 is a schematic cross-sectional view of the electro-luminescent display device according to an aspect of the present disclosure shown in FIG. 4.

FIG. 4 is a plan diagram schematically illustrating the electro-luminescent display device according to an aspect of the present disclosure. Further, FIG. 5 is a schematic cross-sectional view taken along line A-A' of FIG. 4 of the electro-luminescent display device according to an aspect of the present disclosure;

Referring to FIG. 4 and FIG. 5, the display panel according to an aspect of the present disclosure may include an anode 118 disposed on a substrate 110 and a bank 115d having an opening OP that exposes the anode 118. Further, the display panel may include an organic light-emission layer 130 disposed on the opening OP. The display panel may also include first to third color filters CF1, CF2, and CF3 overlapping each other where the first to third color filters CF1, CF2, and CF3 correspond to an edge region of the opening OP and are disposed between the anode 118 and the substrate 110.

Herein, the substrate 110 may include n−1th, nth and n+1th pixel regions defined by a gate line G and a plurality of data lines D. The second color filter CF2 is disposed in an active area AA of the nth pixel region and the first color filter CF1 may be disposed in the n−1th or n+1th pixel region and extended to the edge region of the opening OP. Further, if the first color filter CF1 is disposed in the n−1th pixel region, the display panel according to an aspect of the present disclosure includes the first color filter CF1 extended to one side of the edge region of the opening OP and overlapping one side of the second color filter CF2. In this case, the display panel may further include the third color filter CF3 disposed in the n+1th pixel region and extended to the other side of the edge region of the opening OP and overlapping the other side of the second color filter CF2.

The organic light-emission layer 130 according to an aspect of the present disclosure may contain an organic material that emits white light. The first to third color filters CF1, CF2, and CF3 may contain an organic material that emits light of any one of red, green, and blue.

The display panel according to an aspect of the present disclosure may further include an overcoating layer 115c disposed between the anode 118 and the first to third color filters CF1, CF2, and CF3.

The display panel according to an aspect of the present disclosure may be of a bottom emission type that emits light toward the color filters CF1, CF2, and CF3 below. However, the present disclosure is not limited thereto.

A pixel structure will be described in detail with reference to FIG. 4 and FIG. 5. In the electro-luminescent display device according to an aspect of the present disclosure, a pixel structure may include a scan switch (switching transistor) SW and a drive switch (drive transistor) DR connected to the scan switch SW. The pixel structure may further include an organic light emitting diode (organic light emitting device) OLED connected to the drive switch DR.

The scan switch SW may be formed at an intersection between the gate line G and the data line D. The scan switch SW functions to select a pixel. The scan switch SW may include a scan gate electrode 121a, a scan active layer 124a, and a scan source electrode 122a, and a scan drain electrode 123a which are branched from the gate line G.

Further, the drive switch DR drives an organic light emitting diode OLED of a pixel selected by the scan switch SW. The drive switch DR may include a drive gate electrode 121b electrically connected to the scan drain electrode 123a of the scan switch SW and a drive active layer 124b. The drive switch DR may further include a drive source electrode 122b connected to a first driving power line VDD for supplying first driving power and a drive drain electrode 123b. The drive drain electrode 123b may be connected to the anode 118 of the organic light emitting diode OLED.

In the laminated structure, the substrate 110 formed of glass or plastic may include a plurality of pixel regions n−1, n, and n+1 (n is a natural number) defined by the gate line G and the data lines D. Each of the pixel regions n−1, n, and n+1 may include non-active areas NA1 and NA2 and an active area AA. Further, the plurality of pixel regions n−1, n, and n+1 may sequentially include an n−1th pixel region n−1, an nth pixel region n, and an n+1th pixel region n+1 along the single gate line G.

In a first non-active area NA1 of the nth pixel region, the gate electrodes 121a and 121b of the scan switch SW and the drive switch DR may be formed on the substrate 110.

The gate electrodes 121a and 121b and the gate line G may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

A gate insulating layer 115a may be formed on the gate electrodes 121a and 121b.

The gate insulating layer 115a may be formed of a single layer of an inorganic material such as silicon nitride (SiNx) or silicon oxide (SiOx) or a multilayer of silicon nitride (SiNx) or silicon oxide (SiOx).

The active layers 124a and 124b of the scan switch SW and the drive switch DR may be formed on parts of the gate insulating layer 115a which overlap the gate electrodes 121a and 121b, respectively.

The active layers 124a and 124b may be formed of an oxide semiconductor containing at least one metal selected from Zn, Cd, Ga, In, Sn, Hf, and Zr, amorphous silicon (a-Si), polycrystalline silicon (poly-Si), or an organic semiconductor.

The source electrodes 122a and 122b and the drain electrodes 123a and 123b may be formed, facing each other, on the active layers 124a and 124b at a predetermined distance. Herein, the scan drain electrode 123a of the scan switch SW may be electrically connected to the drive gate electrode 121b of the drive switch DR through a contact hole formed in the gate insulating layer 115a.

The source electrodes 122a and 122b, the drain electrodes 123a and 123b, and the data lines D may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

A protection layer 115b covering the scan switch SW and the drive switch DR may be formed on the entire surface of the substrate.

The second color filter CF2 may be formed corresponding to the active area AA of the nth pixel region n. In this case, the second color filter CF2 may be formed on the substrate 110 and may have an area which can be overlapped with the entire surface of the anode 118. Further, the first color filter CF1 coated on the n−1th pixel region n−1 may be formed extended to the nth pixel region n, i.e., to the first non-active area NA1 of the nth pixel region n. More specifically, the first color filter CF1 may be formed extended to a boundary between the first non-active area NA1 and the active area AA of the nth pixel region n.

Furthermore, the third color filter CF3 coated on the n+1th pixel region n+1 may be extended to the active area AA of the nth pixel region n. Thus, the third color filter CF3 may be formed extended to a boundary between the active area AA of the nth pixel region n and the second non-active area NA2 of the n+1th pixel region n+1. However, the present disclosure is not limited thereto.

The overcoating layer 115c may be formed on the entire surface of the substrate 110. The overcoating layer 115c may function to planarize the surface of the substrate 110.

The overcoating layer 115c may be formed of an organic insulating material. That is, the overcoating layer 115c may be formed of any one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

The anode 118 of the organic light emitting diode OLED may be formed on the overcoating layer 115c. The anode 118 may be provided as a transparent electrode and a reflective electrode. When being provided as a transparent electrode, the anode 118 may be formed of ITO, IZO, ZnO, or In2O3. When being provided as a reflective electrode, the anode 118 may include a reflective film formed of Ag, Mg, Al, Pt, Pd, Au, Ni, Nd, Ir, Cr, and a compound thereof and a film formed of ITO, IZO, ZnO, or $In_2O_3$ on the reflective film.

The anode 118 may be electrically connected to the drain electrode 123b of the drive switch DR through a contact hole formed in the overcoating layer 115c, the second color filter CF2, and the protection color 115b.

Further, the bank 115d to define the pixel regions n−1, n, and n+1 may be formed on the substrate 110 on which the anode 118 has been formed. The bank 115d may define the non-active areas NA1 and NA2 in which the scan switch SW, the drive switch DR and various lines D, G, and VDD are formed and the active area AA in which the organic light emitting diode OLED is formed. The bank 115d may determine an overlap area between the organic light-emission layer 130 and the anode 118. Therefore, the active area AA may be determined by the bank 115d.

The anode 118 may be exposed by the bank 115d.

In the electro-luminescent display device according to an aspect of the present disclosure, an undercut structure is formed under an edge of the bank 115d with a dummy pattern 150. That is, according to an aspect of the present disclosure, an undercut structure is formed under an edge of the bank 115d with the dummy pattern 150 which can be selectively etched relative to the anode 118. Thus, a connection of the organic light-emission layer 130 between neighboring pixels may be cut off.

Lithium (Li) is used for depositing the organic light-emission layer 130 of an electro-luminescent display device. The excessive use of Li can increase the life span of an organic light emitting device. However, the high conductivity properties of Li can cause a current being transferred to a neighboring pixel and thus cause a light emission defect at the neighboring pixel.

According to an aspect of the present disclosure, it was perceived that the organic light-emission layer 130 deposited on the entire surface of the substrate 110, pixels defined by the bank 115d, and the undercut structure formed under the edge of the bank 115d can cut off an inter-pixel connection of the organic light-emission layer 130 deposited on the entire surface of the substrate 110. Thus, the undercut structure is formed under the edge of the bank 115d with the dummy pattern 150 which can be selectively etched relative to the anode 118. Accordingly, it is possible to solve a light emission defect of a neighboring pixel caused by the excessive use of Li in the organic light-emission layer 130. Also, it is possible to increase the life span of the electro-luminescent display device due to an increase of Li. Further, the dummy pattern 150 which can be selectively etched relative to the anode 118 is used to form the undercut structure under the edge of the bank 115d without adding a mask. Thus, it is possible to reduce manufacturing cost and manufacturing processes.

The dummy pattern 150 may be formed under a part of the edge of the bank 115d as shown in FIG. 4 or may be formed along the entire edge of the bank 115d. Herein, the dummy pattern 150 may be formed along at least three edges of the bank 115d to cut off a connection of the organic light-emission layer 130 between neighboring pixels.

The dummy pattern 150 may retreat from a lateral surface of the edge of the bank 115d to the inside of the bank 115d. As a result, the bank 115d and the organic light-emission layer 130 deposited on the anode 118 may be cut off from each other on the lateral surface of the edge of the bank 115d on which the dummy pattern 150 has been formed. The cathode 128 may also be cut off on the lateral surface of the edge of the bank 115d on which the dummy pattern 150 has been formed.

The dummy pattern 150 may be formed of a conductive material, e.g., Cu, Al, IGZO, etc., which can be selectively etched relative to the anode 118.

A first dummy pattern may be formed under an edge of a pixel region with a conductive material which can be selectively etched relative to the anode 118 when the anode 118 is formed. Then, the bank 115d may be formed to allow the first dummy pattern to retreat to the inside of the bank 115d by selective etching. Thus, the dummy pattern 150 may form an undercut structure. Details thereof will be described later.

Then, the organic light-emission layer 130 and the cathode 128 may be sequentially formed on the bank 115d and the anode 118.

FIG. 5 illustrates an example where the anode 118 is electrically connected to the drive drain electrode 123b of the drive switch DR, but the present disclosure is not limited thereto. The anode 118 may be configured to be electrically connected to the drive source electrode 122b of the drive switch DR according to the kind of the thin film transistor, the design method of the drive circuit.

The cathode 128 may be disposed on the organic light-emission layer 130. The cathode 128 may supply electrons into the organic light-emission layer 130. The cathode 128 may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode 128 may be formed of an ytterbium (Yb) alloy or a conductive material.

Figure 6:
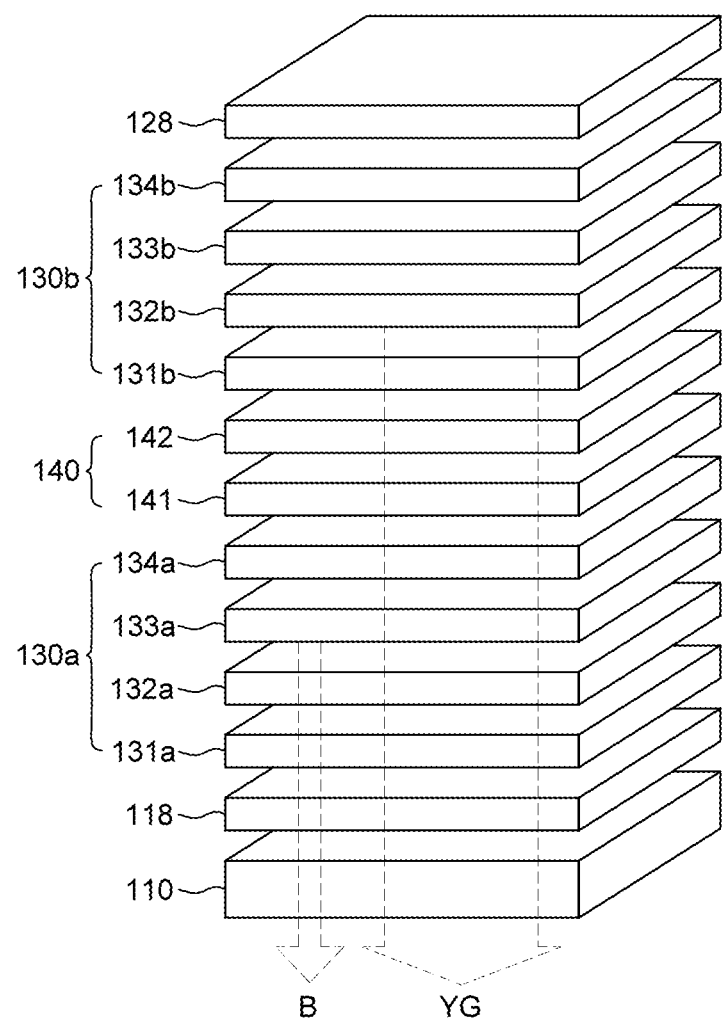
FIG. 6 is a perspective view illustrating an example of a structure of a white organic light emitting device in the electro-luminescent display device according to an aspect of the present disclosure.

FIG. 6 is a perspective view illustrating an example of a structure of a white organic light emitting device in the electro-luminescent display device according to an aspect of the present disclosure.

Referring to FIG. 6, a white organic light emitting device according to an aspect of the present disclosure may include the anode 118 and the cathode 128 facing each other on the substrate 110. The white organic light emitting device may further include a first stack 130a, a charge generation layer (CGL) 140, and a second stack 130b laminated between the anode 118 and the cathode 128.

Such a white organic light emitting device may have a multi-stack structure including a plurality of stacks, and light of different colors from emission layers of the respective stacks may be mixed to emit white light.

The anode 118 is a positive electrode. When being provided as a transparent electrode, the anode 118 may be formed of ITO, IZO, ZnO, or In2O3. When being provided as a reflective electrode, the anode 118 may include a reflective film formed of Ag, Mg, Al, Pt, Pd, Au, Ni, Nd, Ir, Cr, and a compound thereof and a film formed of ITO, IZO, ZnO, or In2O3 on the reflective film.

The cathode 128 is a negative electrode. The cathode 128 may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode 128 may be formed of an ytterbium (Yb) alloy.

The first stack 130a may be disposed between the anode 118 and the CGL 140. The first stack 130a may be formed by laminating a first hole injection layer 131a, a first hole transport layer 132a, a first emission layer 133a, and a first electron transport layer 134a. In this case, the first emission layer 133a may be configured as an emission layer containing a blue fluorescent dopant in a host.

The second stack 130b may be disposed between the CGL 140 and the cathode 128. The second stack 130b may be formed by laminating a second hole transport layer 131b, a second emission layer 132b, a second electron transport layer 133b, and a first electron injection layer 134b. In this case, the second emission layer 132b may be a single emission layer containing a yellow-green phosphorescent dopant in a host, green and red phosphorescent dopants in a host, or a yellow-green phosphorescent dopant in two hosts. However, the present disclosure is not limited thereto.

The CGL 140 is formed between the stacks 130a and 130b to regulate the charge balance between the stacks 130a and 130b. The CGL 140 may include an N-type CGL 141, a P-type CGL 142, and a buffer layer (not illustrated) between the N-type CGL 141 and the P-type CGL 142.

In this case, the N-type CGL 141 is laminated adjacent to the first electron transport layer 134a of the first stack 130a and may function to inject and transport electrons of the first stack 130a. The N-type CGL 141 may be formed of any one of an organic material doped with alkali metal, an organic material doped with an alkali metal compound, and an organic material used for forming an electron injection layer or an electron transport layer.

Further, the P-type CGL 142 is laminated adjacent to the second hole transport layer 131b of the second stack 130b and may function to inject and transport holes of the second stack 130b. The P-type CGL 142 may be formed of a P-type organic material used for forming a hole injection layer or a hole transport layer.

The buffer layer may block an electrochemical reaction and an interaction at an interface between the N-type CGL 141 and the P-type CGL 142. Thus, the buffer layer can suppress the degradation of the materials and improve the life span and efficiency of the device.

An N-type CGL has been typically used by doping Li with an electron transport layer. In this case, Li functions to enable electrons to easily enter the electron transport layer and control the life span of an organic light emitting device. Therefore, the amount of Li has been on the increase. As the amount of Li increases, the life span of the organic light emitting device can increase. However, the high conductivity properties of Li can cause a current being transferred to a neighboring pixel and thus cause a light emission defect of the neighboring pixel. Accordingly, the amount of Li has been limited to a small amount.

The above-described light emission defect is caused by high conductivity of Li and refers to light emission from a part of a neighboring pixel when current leakage occurs due to the high conductivity of Li.

Figure 7:
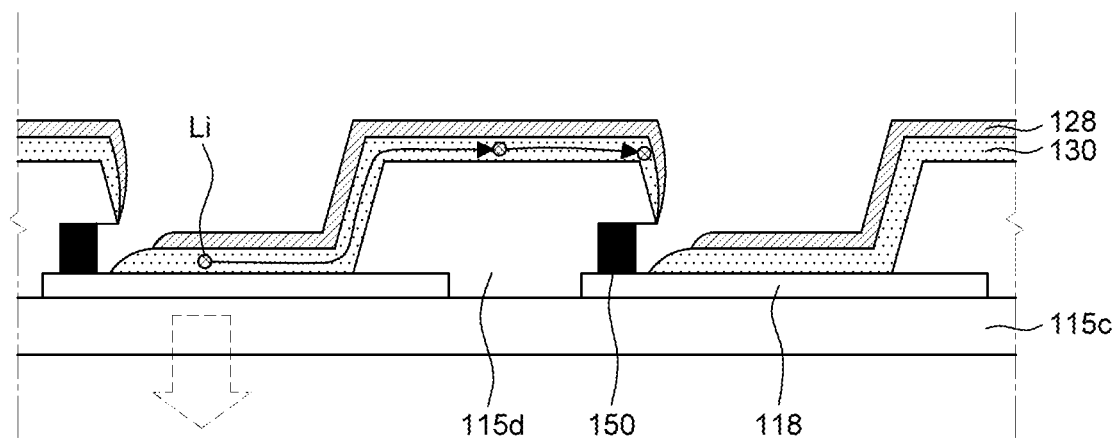
FIG. 7 is a schematic cross-sectional view illustrating a part of the electro-luminescent display device according to an aspect of the present disclosure.

FIG. 7 is a schematic cross-sectional view illustrating a part of the electro-luminescent display device according to an aspect of the present disclosure. Further, FIG. 8 is a schematic cross-sectional view illustrating a part of an electro-luminescent display device according to a comparative example.

Figure 8:
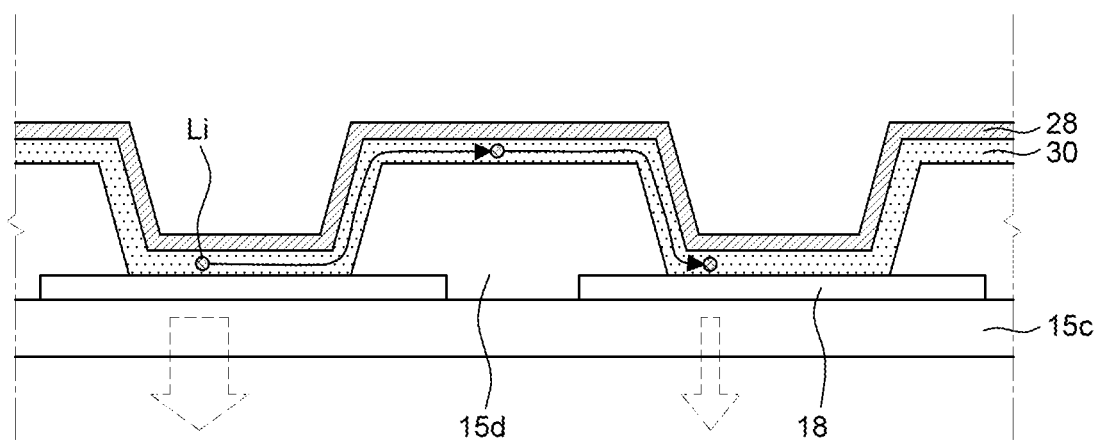
FIG. 8 is a schematic cross-sectional view illustrating a part of an electro-luminescent display device according to a comparative example.

For convenience, FIG. 7 and FIG. 8 do not illustrate components disposed under an overcoating layer.

Referring to FIG. 7, in the electro-luminescent display device according to an aspect of the present disclosure, the overcoating layer 115c may be formed on the entire surface of a substrate. The overcoating layer 115c may function to planarize the surface of the substrate.

The overcoating layer 115c may be formed of an organic insulating material. That is, the overcoating layer 115c may be formed of one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

The anode 118 of an organic light emitting diode may be formed on the overcoating layer 115c. The anode 118 may be provided as a transparent electrode and a reflective electrode. When being provided as a transparent electrode, the anode 118 may be formed of ITO, IZO, ZnO, or In2O3. When being provided as a reflective electrode, the anode 118 may include a reflective film formed of Ag, Mg, Al, Pt, Pd, Au, Ni, Nd, Ir, Cr, and a compound thereof and a film formed of ITO, IZO, ZnO, or $In_2O_3$ on the reflective film.

The anode 118 may be electrically connected to a drain electrode of a drive switch through a contact hole.

Further, the bank 115d to define pixel regions may be formed on the substrate on which the anode 118 has been formed. As described above, the bank 115d may define non-active areas in which a scan switch, the drive switch and various lines are formed and an active area in which the organic light emitting diode is formed.

The bank 115d may determine an overlap area between the organic light-emission layer 130 and the anode 118. Therefore, the active area may be determined by the bank 115d.

The anode 118 may be exposed by the bank 115d.

In the electro-luminescent display device according to an aspect of the present disclosure, an undercut structure is formed under an edge of the bank 115d with the dummy pattern 150. That is, an undercut structure is formed under an edge of the bank 115d with the dummy pattern 150 which can be selectively etched relative to the anode 118. Thus, a connection of the organic light-emission layer 130 between neighboring pixels may be cut off.

Then, the organic light-emission layer 130 and the cathode 128 may be sequentially formed on the bank 115d and the anode 118. In this case, a connection of the organic light-emission layer 130 between neighboring pixels may be cut off on a lateral surface of the edge of the bank 115d on which the dummy pattern 150 has been formed. The cathode 128 may also be cut off on the lateral surface of the edge of the bank 115d on which the dummy pattern 150 has been formed.

Therefore, even if the amount of Li increases, Li from the organic light-emission layer 130 of a pixel cannot move to its neighboring pixel due to the cutoff of the organic light-emission layer 130.

Referring to FIG. 8, in the electro-luminescent display device according to a comparative example, Li from an organic light-emission layer 30 of a pixel moves to its neighboring pixel. Thus, a light emission defect occurs in a part of the neighboring pixel.

For reference, in the electro-luminescent display device according to a comparative example, an overcoating layer 15c is formed on the entire surface of a substrate.

An anode 18 of an organic light emitting diode is formed on the overcoating layer 15c.

A bank 15d defining pixel regions is formed on the substrate on which the anode 18 has been formed.

Further, an organic light-emission layer 30 and a cathode 28 may be sequentially formed on the bank 15d and the anode 18 throughout the entire surface of the substrate.

As described above, it can be seen that in the electro-luminescent display device according to a comparative example, Li from the organic light-emission layer 30 of the pixel moves to its neighboring pixel, and, thus, a light emission defect occurs in a part of the neighboring pixel.

The above-described light emission defect is caused by high conductivity of Li. A current cannot move in the anode 18 and a region where the bank 15d is present between the anodes 18, but current leakage occurs due to the high conductivity of Li. Thus, even a part of the neighboring pixel may emit light. Therefore, the amount of Li is controlled based on whether a light emission defect occurs or not.

According to an aspect of the present disclosure, as shown in FIG. 7, it was perceived that the organic light-emission layer 130 deposited on the entire surface of the substrate 110, pixels defined by the bank 115d, and the undercut structure formed under the edge of the bank 115d can cut off an inter-pixel connection of the organic light-emission layer 130 deposited on the entire surface of the substrate 110. Thus, the undercut structure is formed under the edge of the bank 115d with the dummy pattern 150 which can be selectively etched relative to the anode 118. Accordingly, it is possible to solve a light emission defect of a neighboring pixel caused by the excessive use of Li in the organic light-emission layer 130. Also, it is possible to increase the life span of the electro-luminescent display device due to an increase of Li. Further, the dummy pattern 150 which can be selectively etched relative to the anode 118 is used to form the above-described undercut structure under the edge of the bank 115d without adding a mask. Thus, it is possible to reduce manufacturing cost and manufacturing processes.

The dummy pattern 150 may be formed under a part of the edge of the bank 115d as shown in FIG. 7 or may be formed along the entire edge of the bank 115d. Herein, the dummy pattern 150 may be formed along at least three edges of the bank 115d to cut off a connection of the organic light-emission layer 130 between neighboring pixels.

The dummy pattern 150 may retreat from a lateral surface of the edge of the bank 115d to the inside of the bank 115d. As a result, the bank 115d and the organic light-emission layer 130 deposited on the anode 118 may be cut off from each other on the lateral surface of the edge of the bank 115d on which the dummy pattern 150 has been formed. The cathode 128 may also be cut off on the lateral surface of the edge of the bank 115d on which the dummy pattern 150 has been formed.

The dummy pattern 150 may be formed of a conductive material, e.g., Cu, Al, IGZO, etc., which can be selectively etched relative to the anode 118.

A first dummy pattern may be formed under an edge of a pixel region with a conductive material which can be selectively etched relative to the anode 118 when the anode 118 is formed. Then, the bank 115d may be formed to allow the first dummy pattern to retreat to the inside of the bank 115d by selective etching. Thus, the dummy pattern 150 may form an undercut structure. Details thereof will be described with reference to processes for fabricating an electro-luminescent display device according to an aspect of the present disclosure.

FIG. 9A through FIG. 9H are cross-sectional views sequentially illustrating a part of the processes for fabricating an electro-luminescent display device according to an aspect of the present disclosure.

Figure 9A:
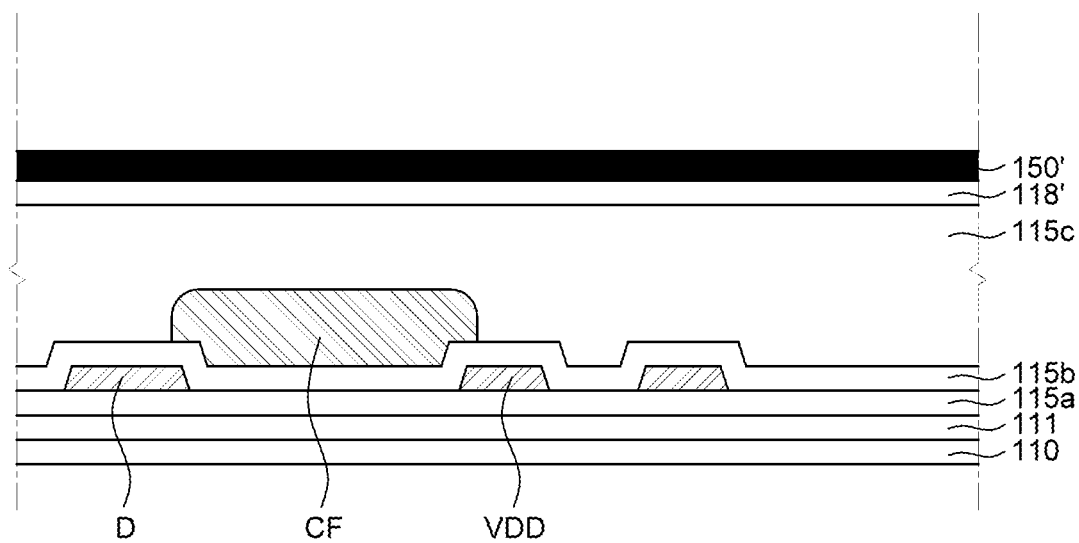
FIG. 9A through FIG. 9H are cross-sectional views sequentially illustrating a part of processes for fabricating an electro-luminescent display device according to an aspect of the present disclosure.

Referring to FIG. 9A, a buffer layer 111 may be formed on the substrate 110 which is transparent.

Then, first and second gate electrodes and a gate line may be formed as a first layer on the buffer layer 111.

The first and second gate electrodes and the gate line may be formed by forming a first metal layer on the substrate 110 and selectively patterning the first metal layer through a mask process.

The mask process refers to a series of processes including: forming a photoresist layer on a substrate; performing exposure and development using a mask to form a predetermined photoresist pattern; and performing etching using the photoresist pattern as an etching mask.

The first metal layer may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

Then, the gate insulating layer 115a may be formed on the entire surface of the substrate 110 on which the first and second gate electrodes and the gate line have been formed.

The gate insulating layer 115a may be formed of a single layer of an inorganic material such as silicon nitride (SiNx) or silicon oxide (SiOx) or a multilayer of silicon nitride (SiNx) or silicon oxide (SiOx).

Then, a first active layer and a second active layer may be formed on the substrate 110.

The first and second active layers may be formed of an oxide semiconductor containing at least one metal of Zn, Cd, Ga, In, Sn, Hf, and Zr, a-Si, poly-Si, or an organic semiconductor.

Then, first and second source electrodes, first and second drain electrodes, a data line D, and a power supply line VDD may be formed as a second metal layer on the substrate 110.

The second metal layer may be formed of one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

After the first and second source electrodes, the first and second drain electrodes, the data line D, and the power supply line VDD are formed, the protection layer 115b may be formed on the substrate 110.

Then, a color filter CF may be formed on the substrate 110 through a mask process.

Then, the overcoating layer 115c may be formed on the substrate 110.

The overcoating layer 115c may be formed of an organic insulating material. That is, the overcoating layer 115c may be formed of any one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

Then, a light emitting device may be formed on the substrate 110. The light emitting device is an organic light emitting device. The organic light emitting device may include an anode formed on the overcoating layer and electrically connected to a drain electrode of a drive switch, an organic light-emission layer disposed on the anode, and a cathode formed on the organic light-emission layer.

A third metal layer 118' and a fourth metal layer 150' may be formed on the entire surface of the substrate 110.

The third metal layer 118' may be formed of ITO, IZO, ZnO, or $In_2O_3$ to form an anode. The third metal layer 118' may be formed with, for example, ITO of 1000 Å thick. However, the present disclosure is not limited thereto.

The fourth metal layer 150' may be formed of a conductive material, e.g., Cu, Al, IGZO, etc., which can be selectively etched relative to the third metal layer 118' to form a dummy pattern. Further, the fourth metal layer 150' may be formed with, for example, Cu of 3000 Å thick. However, the present disclosure is not limited thereto.

Figure 9B:
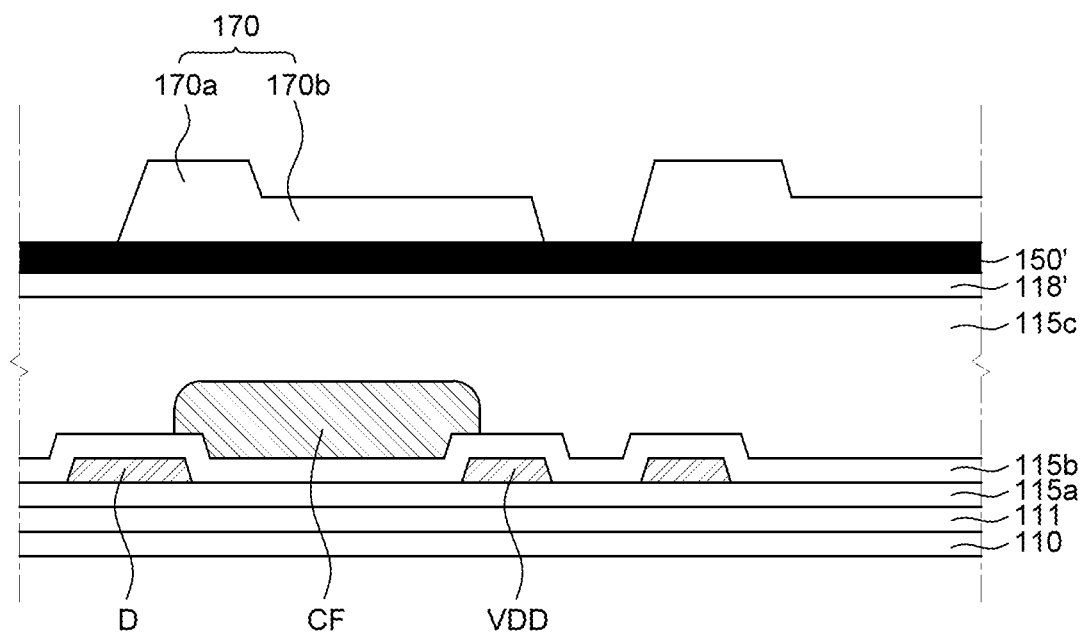

Then, referring to FIG. 9B, a photoresist pattern 170 having different thicknesses may be formed on the substrate 110 on which the fourth metal layer 150' has been formed.

The photoresist pattern 170 may be formed using a half-tone mask and may include a first photoresist pattern 170a having a first thickness and a second photoresist pattern 170b having a second thickness smaller than the first thickness.

Figure 9C:
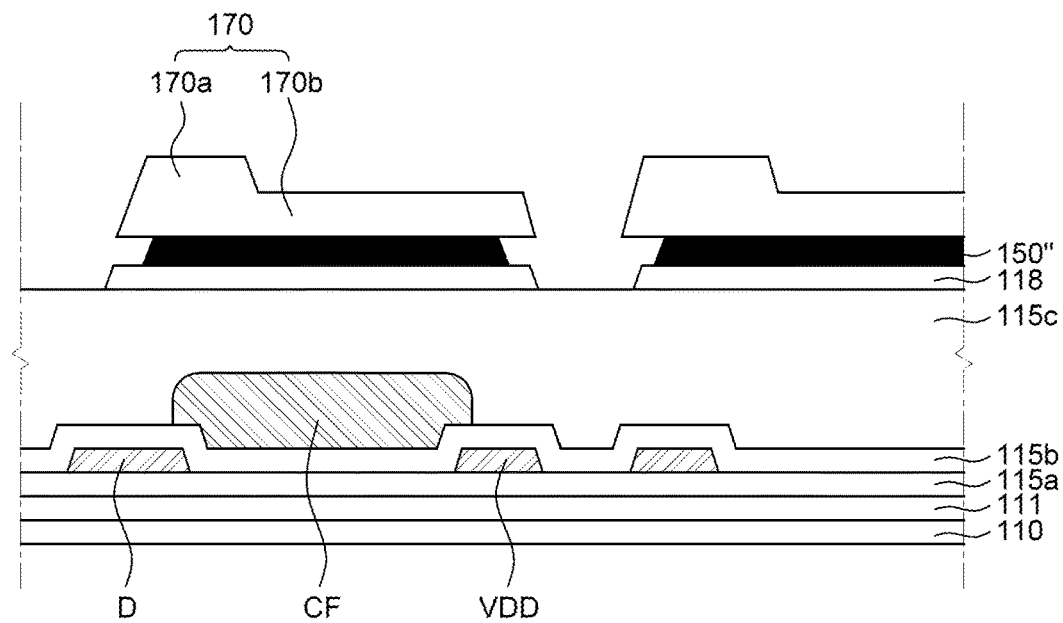

Then, referring to FIG. 9C, the third metal layer 118' and the fourth metal layer 150' may be selectively etched using the photoresist pattern 170 as a mask to form the anode 118 and a fourth metal layer pattern 150".

In this case, wet etching may be used to etch the third metal layer 118' and the fourth metal layer 150'.

Figure 9D:
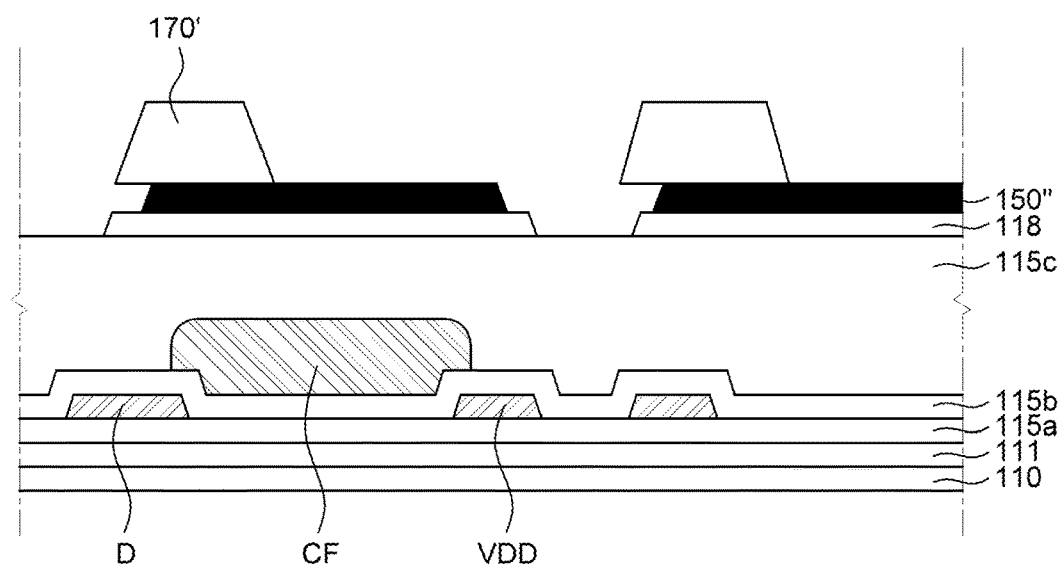

Then, referring to FIG. 9D, the photoresist pattern 170 may be ashed to remove the second photoresist pattern 170b and form a third photoresist pattern 170a' having a third thickness at the same time.

Figure 9E:
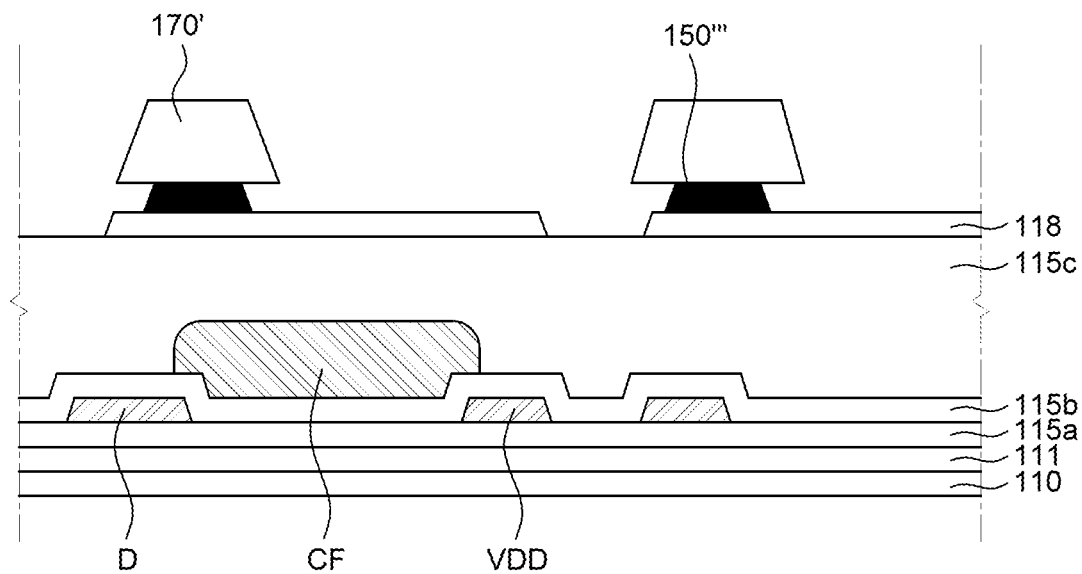

Then, referring to FIG. 9E, the fourth metal layer pattern 150" may be selectively etched using the third photoresist pattern 170a' as a mask to form a primary dummy pattern 150''' of the fourth metal layer on an edge of the anode 118.

In this case, wet etching may be used to etch the fourth metal layer pattern 150", and the primary dummy pattern 150''' may retreat to the inside of the third photoresist pattern 170a' through over-etching.

Then, the third photoresist pattern 170a' may be removed using remaining strips.

Figure 9F:
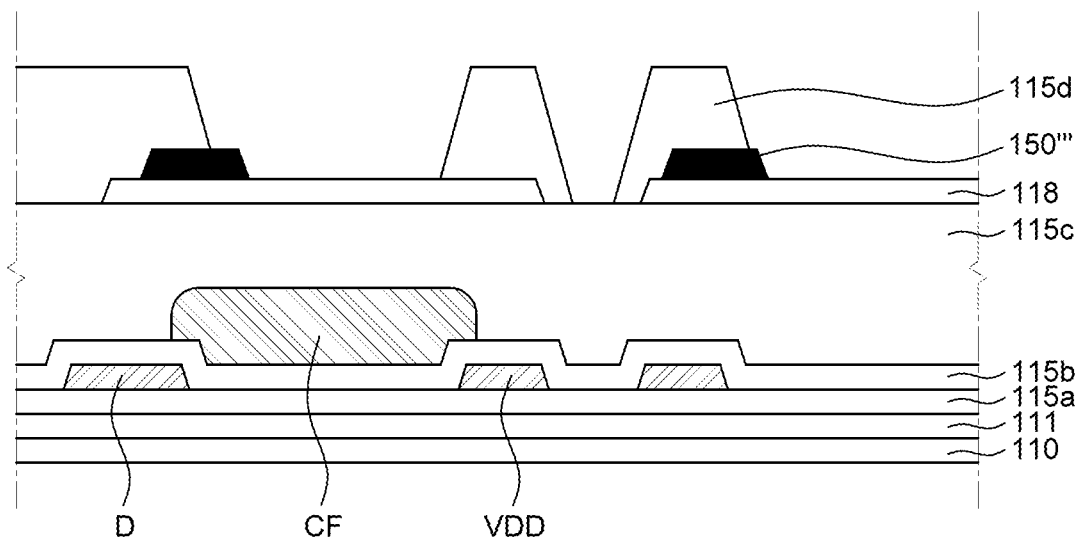

Then, referring to FIG. 9F, the predetermined bank 115d to define pixel regions may be formed on the substrate 110.

The bank 115d may be formed of an organic insulating material. For example, the bank 115d may be formed of resin based on polyimide, acryl, or benzocyclobutene (BCB), but the present disclosure is not limited thereto.

As described above, the bank 115d may determine an overlap area between the organic light-emission layer and the anode 118. Therefore, an active area may be determined by the bank 115d.

The anode 118 and the primary dummy pattern 150''' may be exposed by the bank 115d.

The bank 115d may expose one side of the primary dummy pattern 150'''. Therefore, the non-exposed part of the primary dummy pattern 150''' may be covered by the bank 115d.

Figure 9G:
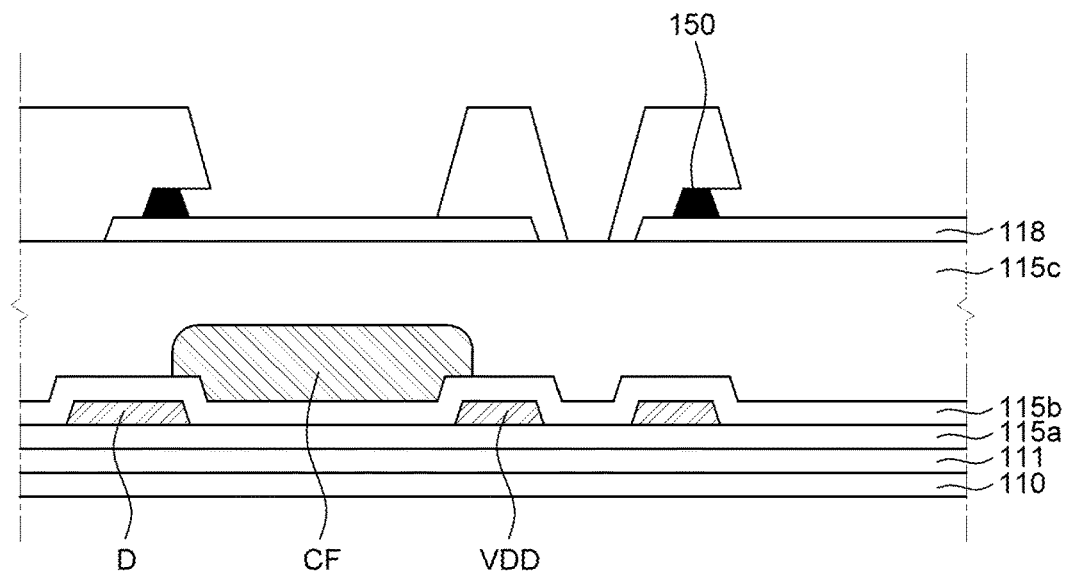

Then, referring to FIG. 9G, the primary dummy pattern 150''' exposed by the bank 115d may be selectively etched to form the dummy pattern 150 of the fourth metal layer under an edge of the bank 115d.

In this case, the dummy pattern 150 may be formed under a part of the edge of the bank 115d as shown in FIG. 9G or may be formed along the entire edge of the bank 115d.

In this case, wet etching may be used to etch the primary dummy pattern 150'''.

The dummy pattern 150 may retreat from a lateral surface of the edge of the bank 115d to the inside of the bank 115d.

Then, a heat treatment may be performed at a temperature of, e.g., 210□C for 90 minutes. However, the present disclosure is not limited thereto.

Figure 9H:
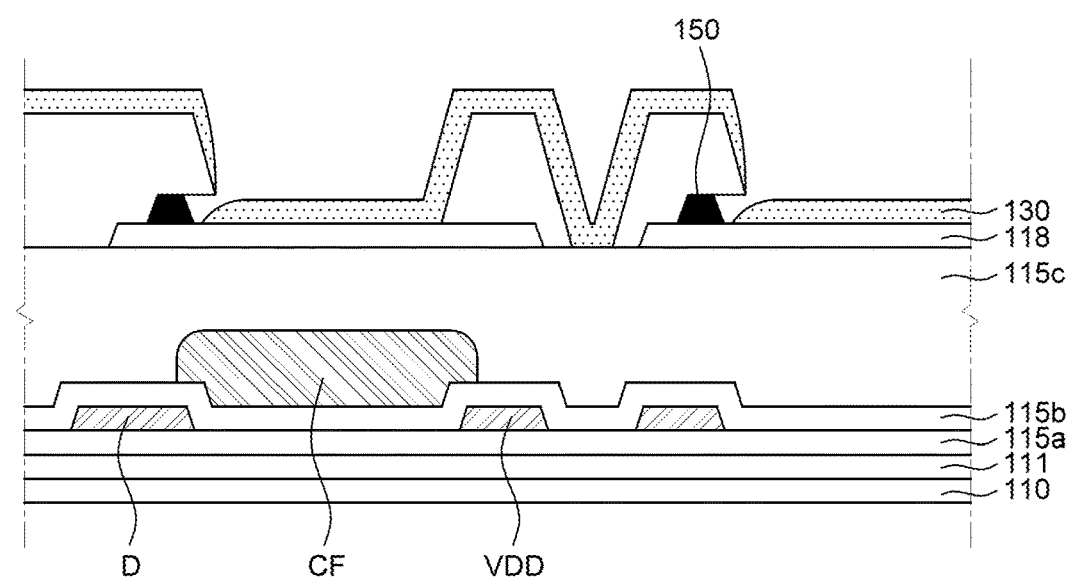

Then, referring to FIG. 9H, the organic light-emission layer 130 and a cathode may be sequentially formed on the entire surface of the substrate 110. In this case, the bank 115d and the organic light-emission layer 130 deposited on the anode 118 may be cut off from each other on the lateral surface of the edge of the bank 115d on which the dummy pattern 150 has been formed.

The organic light-emission layer 130 is an organic layer to emit light of a specific color and may include any one of a red organic light-emission layer, a green organic light-emission layer, a blue organic light-emission layer, and a white organic light-emission layer. The organic light-emission layer 130 may also include various organic layers such as a hole transport layer, a hole injection layer, an electron injection layer, an electron transport layer, and the like.

Although not illustrated, the cathode may be formed on the organic light-emission layer 130. The cathode may supply electrons into the organic light-emission layer 130. The cathode may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode may be formed of an ytterbium (Yb) alloy or a conductive material.

The organic light emitting device configured as described above is vulnerable to moisture. An encapsulation unit configured to protect the organic light emitting device against moisture may be formed on the organic light emitting device. For example, the encapsulation unit may have a structure in which inorganic layers and organic layers are alternately laminated. However, the present disclosure is not limited thereto.

Figure 10:
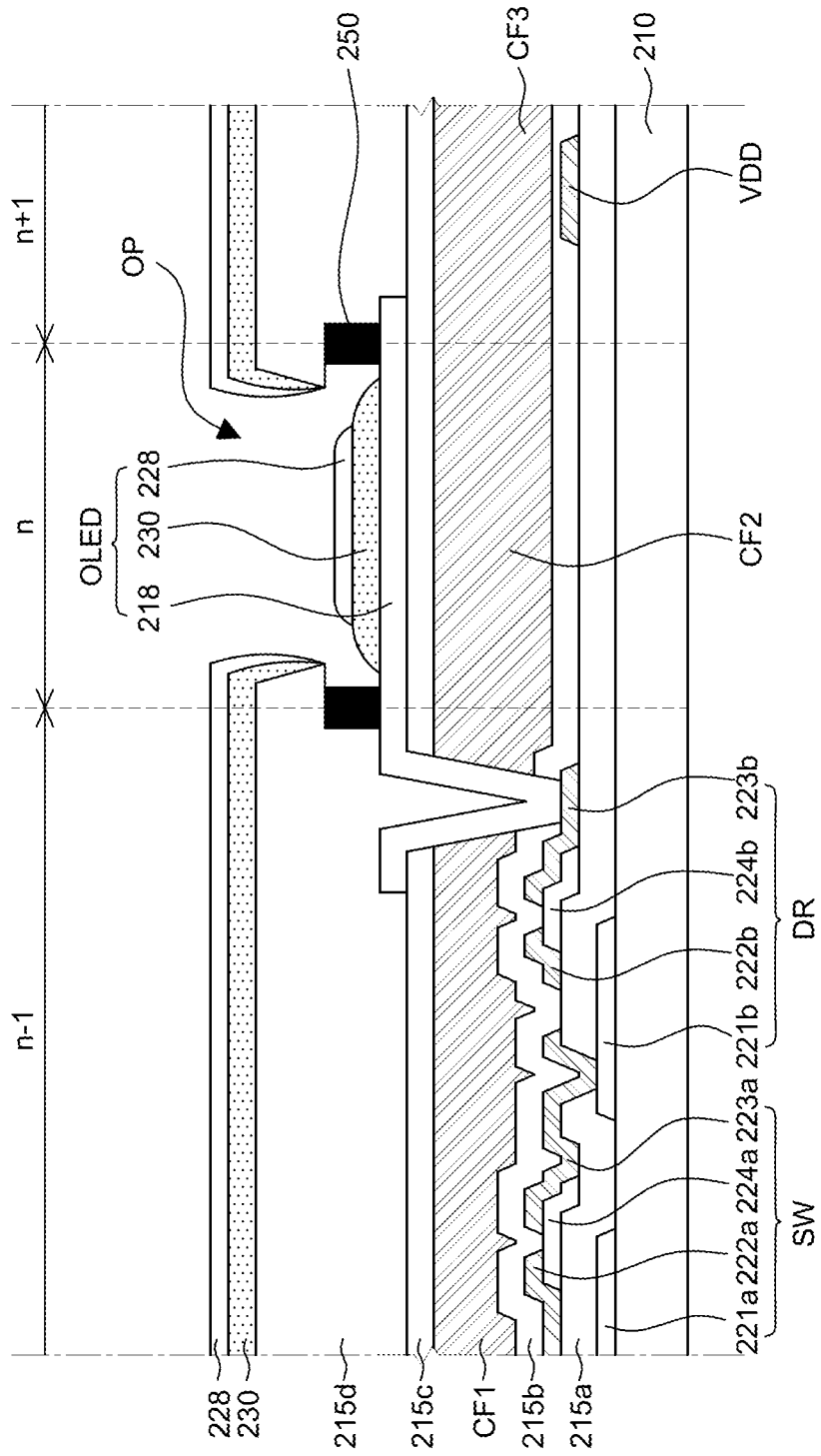
FIG. 10 is a schematic cross-sectional view illustrating a part of an electro-luminescent display device according to another aspect of the present disclosure.

FIG. 10 is a schematic cross-sectional view illustrating a part of an electro-luminescent display device according to another aspect of the present disclosure.

The electro-luminescent display device according to another aspect of the present disclosure illustrated in FIG. 10 is substantially the same as the above-described electro-luminescent display device according to an aspect of the present disclosure except that a dummy pattern is formed along the entire edge of a bank.

Referring to FIG. 10, a display panel according to another aspect of the present disclosure may include an anode 218 disposed on a substrate 210 and a bank 215d having an opening OP that exposes the anode 218. Further, the display panel may include an organic light-emission layer 230 disposed on the opening OP. The display panel may also include first to third color filters CF1, CF2, and CF3 overlapping each other where the first to third color filters CF1, CF2, and CF3 correspond to an edge region of the opening OP and are disposed between the anode 218 and the substrate 210.

Herein, the substrate 210 may include n−1th, nth and n+1th pixel regions defined by a gate line G and a plurality of data lines D. The second color filter CF2 is disposed in an active area AA of the nth pixel region and the first color filter CF1 may be disposed in the n−1th or n+1th pixel region and extended to the edge region of the opening OP. Further, if the first color filter CF1 is disposed in the n−1th pixel region, the display panel according to another aspect of the present disclosure includes the first color filter CF1 extended to one side of the edge region of the opening OP and overlapping one side of the second color filter CF2. In this case, the display panel may further include the third color filter CF3 disposed in the n+1th pixel region and extended to the other side of the edge region of the opening OP and overlapping the other side of the second color filter CF2.

The organic light-emission layer 230 according to another aspect of the present disclosure may contain an organic material that emits white light. The first to third color filters CF1, CF2, and CF3 may contain an organic material that emits light of any one of red, green, and blue.

The display panel according to another aspect of the present disclosure may further include an overcoating layer 215c disposed between the anode 218 and the first to third color filters CF1, CF2, and CF3.

The display panel according to another aspect of the present disclosure may be of a bottom emission type that emits light toward the color filters CF1, CF2, and CF3 below. However, the present disclosure is not limited thereto.

A pixel structure will be described in detail. In the electro-luminescent display device according to another aspect of the present disclosure, a pixel structure may include a scan switch (i.e., switching transistor) SW and a drive switch (i.e., drive transistor) DR connected to the scan switch SW. The pixel structure may further include an organic light emitting diode (i.e., organic light emitting device) OLED connected to the drive switch DR.

The scan switch SW may be formed at an intersection between a gate line and a data line. The scan switch SW functions to select a pixel. The scan switch SW may include a scan gate electrode 221a, a scan active layer 224a, and a scan source electrode 222a, and a scan drain electrode 223a which are branched from the gate line.

Further, the drive switch DR drives an organic light emitting diode OLED of a pixel selected by the scan switch SW. The drive switch DR may include a drive gate electrode 221b electrically connected to the scan drain electrode 223a of the scan switch SW and a drive active layer 224b. The drive switch DR may further include a drive source electrode 222b connected to a first driving power line for supplying first driving power and a drive drain electrode 223b. The drive drain electrode 223b may be connected to the anode 218 of the organic light emitting diode OLED.

In the laminated structure, the substrate 210 formed of glass or plastic may include a plurality of pixel regions n−1, n, and n+1 (n is a natural number) defined by a gate line and data lines. Each of the pixel regions n−1, n, and n+1 may include non-active areas NA1 and NA2 and an active area AA. Further, the plurality of pixel regions n−1, n, and n+1 may sequentially include an n−1th pixel region n−1, an nth pixel region n, and an n+1th pixel region n+1 along the single gate line.

In a first non-active area NA1 of the nth pixel region, the gate electrodes 221a and 221b of the scan switch SW and the drive switch DR may be formed on the substrate 210.

The first and second gate electrodes 221a and 221b and the gate line may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

A gate insulating layer 215a may be formed on the gate electrodes 221a and 221b.

The gate insulating layer 215c may be formed of a single layer of an inorganic material such as silicon nitride (SiNx) or silicon oxide (SiOx) or a multilayer of silicon nitride (SiNx) or silicon oxide (SiOx).

The active layers 224a and 224b of the scan switch SW and the drive switch DR may be formed on parts of the gate insulating layer 215a which overlap the gate electrodes 221a and 221b, respectively.

The active layers 224a and 224b may be formed of an oxide semiconductor containing at least one metal of Zn, Cd, Ga, In, Sn, Hf, and Zr, a-Si, poly-Si, or an organic semiconductor.

The source electrodes 222a and 222b and the drain electrodes 223a and 223b may be formed, facing each other, on the active layers 224a and 224b at a predetermined distance. Herein, the scan drain electrode 223a of the scan switch SW may be electrically connected to the drive gate electrode 221b of the drive switch DR through a contact hole formed in the gate insulating layer 215a.

The source electrodes 222a and 222b, the drain electrodes 223a and 223b, and the data lines may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

A protection layer 215b covering the scan switch SW and the drive switch DR may be formed on the entire surface of the substrate.

The second color filter CF2 may be formed corresponding to the active area AA of the nth pixel region n. In this case, the second color filter CF2 may be formed on the substrate 210 and may have an area which can be overlapped with the entire surface of the anode 218. Further, the first color filter CF1 coated on the n−1th pixel region n−1 may be formed extended to the nth pixel region n, i.e., to the first non-active area NA1 of the nth pixel region n. More specifically, the first color filter CF1 may be formed extended to a boundary between the first non-active area NA1 and the active area AA of the nth pixel region n.

Furthermore, the third color filter CF3 coated on the n+1th pixel region n+1 may be extended to the active area AA of the nth pixel region n. Thus, the third color filter CF3 may be formed extended to a boundary between the active area AA of the nth pixel region n and the second non-active area NA2 of the n+1th pixel region n+1. However, the present disclosure is not limited thereto.

The overcoating layer 215c may be formed on the entire surface of the substrate 210. The overcoating layer 215c may function to planarize the surface of the substrate 210.

The overcoating layer 215c may be formed of an organic insulating material. That is, the overcoating layer 215c may be formed of any one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

The anode 218 of the organic light emitting diode OLED may be formed on the overcoating layer 215c. The anode 218 may be provided as a transparent electrode and a reflective electrode. When being provided as a transparent electrode, the anode 218 may be formed of ITO, IZO, ZnO, or In2O3. When being provided as a reflective electrode, the anode 218 may include a reflective film formed of Ag, Mg, Al, Pt, Pd, Au, Ni, Nd, Ir, Cr, and a compound thereof and a film formed of ITO, IZO, ZnO, or $In_2O_3$ on the reflective film.

The anode 218 may be electrically connected to the drain electrode 223b of the drive switch DR through a contact hole formed in the overcoating layer 215c, the second color filter CF2, and the protection layer 215b.

Further, the bank 215d to define the pixel regions n−1, n, and n+1 may be formed on the substrate 210 on which the anode 218 has been formed. The bank 215d may define the non-active areas NA1 and NA2 in which the scan switch SW, the drive switch DR and various lines are formed and the active area AA in which the organic light emitting diode OLED is formed. The bank 215d may determine an overlap area between the organic light-emission layer 230 and the anode 218. Therefore, the active area AA may be determined by the bank 215d.

The anode 218 may be exposed by the bank 215d.

In the electro-luminescent display device according to another aspect of the present disclosure, an undercut structure is formed under an edge of the bank 215d with a dummy pattern 250 as described above. That is, according to another aspect of the present disclosure, an undercut structure is formed under an edge of the bank 215d with the dummy pattern 250 which can be selectively etched relative to the anode 218. Thus, a connection of the organic light-emission layer 230 between neighboring pixels may be cut off.

Particularly, in the electro-luminescent display device according to another aspect of the present disclosure, the dummy pattern 250 is formed along the entire edge of the bank 215d. In this case, it is possible to more effectively cut off a connection of the organic light-emission layer 230 between neighboring pixels. Thus, the amount of Li can be further increased. Therefore, it is possible to further increase the life span of the electro-luminescent display device.

The dummy pattern 250 may retreat from a lateral surface of the edge of the bank 215d to the inside of the bank 215d. Thus, the bank 215d and the organic light-emission layer 230 deposited on the anode 218 may be cut off from each other on the lateral surface of the edge of the bank 215d on which the dummy pattern 250 has been formed. The cathode 228 may also be cut off on the lateral surface of the edge of the bank 215d on which the dummy pattern 250 has been formed.

The dummy pattern 250 may be formed of a conductive material, e.g., Cu, Al, IGZO, etc., which can be selectively etched relative to the anode 218.

A first dummy pattern may be formed under an edge of a pixel region with a conductive material which can be selectively etched relative to the anode 218 when the anode 218 is formed. Then, the bank 215d may be formed to allow the first dummy pattern to retreat to the inside of the bank 215d by selective etching. Thus, the dummy pattern 250 may form an undercut structure in the same manner as in the above-described aspect of the present disclosure.

Then, the organic light-emission layer 230 and the cathode 228 may be sequentially formed on the bank 215d and the anode 218.

The cathode 228 may be disposed on the organic light-emission layer 230. The cathode 228 may supply electrons into the organic light-emission layer 230. The cathode 228 may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode 228 may be formed of an ytterbium (Yb) alloy or a conductive material.

The exemplary aspects of the present disclosure can also be described as follows:

According to an aspect of the present disclosure, there is provided an electro-luminescent display device. The electro-luminescent display device includes an anode disposed on a substrate; a bank having an opening that exposes the anode; a dummy pattern disposed under an edge of the bank and preparing an undercut structure within the bank; an organic light-emission layer which is disposed on the substrate and whose connection between neighboring pixels is cut off by the dummy pattern; and a cathode disposed on the organic light-emission layer.

The organic light-emission layer may have a multi-stack structure including a plurality of stacks.

The connection of the organic light-emission layer between the neighboring pixels may be cut off on a lateral surface of the edge of the bank.

The dummy pattern may be made of a metal material which is selectively etched relative to the anode.

The anode may be made of ITO, IZO, ZnO, or In2O3, and the dummy pattern may be made of Cu, Al, or IGZO.

The dummy pattern may be disposed along at least three edges of the bank.

The dummy pattern may be disposed along the entire edge of the bank.

According to another aspect of the present disclosure, there is provided an electro-luminescent display device. The electro-luminescent display device includes an anode disposed on a substrate; a bank having an opening that exposes the anode; a dummy pattern disposed under an edge of the bank and preparing an undercut structure within the bank; an organic light-emission layer disposed on the substrate on which the anode and the bank have been disposed; and a cathode disposed on the organic light-emission layer, wherein a connection of the organic light-emission layer between neighboring pixels is cut off by the dummy pattern to suppress the movement of Li in the organic light-emission layer to the neighboring pixels.

According to an aspect of the present disclosure, there is provided a method of fabricating an electro-luminescent display device. The method of fabricating an electro-luminescent display device includes forming a first metal layer and a second metal layer on a substrate; forming a photoresist pattern on the substrate; forming an anode and a second metal layer pattern by etching the first and second metal layers using the photoresist pattern as a mask; ashing the photoresist pattern and forming a first dummy pattern by etching the second metal layer pattern using the ashed photoresist pattern as a mask; forming a bank on the substrate to expose one side of the first dummy pattern; forming a dummy pattern under an edge of the bank to form an undercut structure within the bank by etching the first dummy pattern; and forming an organic light-emission layer and a cathode on the substrate, wherein a connection of the organic light-emission layer between neighboring pixels is cut off by the dummy pattern.

The organic light-emission layer may have a multi-stack structure including a plurality of stacks.

The second metal layer may be formed of a material which is selectively etched relative to the first metal layer.

The first metal layer may be formed of ITO, IZO, ZnO, or In2O3, and the second metal layer may be formed of Cu, Al, or IGZO.

The dummy pattern may be disposed along at least three edges of the bank.

The dummy pattern may be disposed along the entire edge of the bank.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electro-luminescent display device, comprising:
a substrate having an emission area and a non-emission area;
a thin film transistor disposed on the substrate in the non-emission area;
an anode disposed on an insulating layer that is disposed over the substrate and connected to the thin film transistor;
a bank having an opening that exposes a portion of the anode and having an undercut structure adjacent to the opening in the emission area, wherein the bank is spaced apart from an adjacent bank;
a dummy pattern disposed at the undercut structure of the bank;
an organic layer disposed on the anode and the bank and electrically disconnected with at least one of adjacent pixels,
wherein the organic layer includes a first organic layer disposed on the anode in the emission area and having an end portion spaced apart from the dummy pattern and extended to a region between two adjacent banks to contact an exposed portion of the insulating layer and a second organic layer disposed on the bank in the non-emission area,
an organic light emitting device including the organic layer and having a multi-stack structure to emit white light including a first stack having a first emission layer, a second stack having a second emission layer and a charge generation layer between the first stack and the second stack;
first to third color filters disposed between the anode and the substrate, wherein edges of the first and second color filters overlap with the dummy pattern; and
a cathode disposed on the organic layer,
wherein the cathode includes a first cathode disposed on the first organic layer in the emission area and having an end portion spaced apart from the dummy pattern and a second cathode disposed on the second organic layer above the bank in the non-emission area, and
wherein at least a portion of the first cathode is connected to the second cathode.

2. The electro-luminescent display device according to claim 1, wherein the organic layer is electrically disconnected with at least one of adjacent pixels at a lateral surface of an edge of the opening of the bank.

3. The electro-luminescent display device according to claim 1, wherein the dummy pattern includes a metal material which is selectively etched relative to the anode.

4. The electro-luminescent display device according to claim 3, wherein the anode includes ITO, IZO, ZnO, or In2O3, and the dummy pattern includes Cu, Al, or IGZO.

5. The electro-luminescent display device according to claim 1, wherein the dummy pattern is disposed along at least three edges of the opening of the bank.

6. The electro-luminescent display device according to claim 5, wherein the dummy pattern is disposed along the entire edge of the opening of the bank.

7. The electro-luminescent display device according to claim 1, further comprising:
color filters overlapping each other where the color filters correspond to an edge region of the opening and are disposed between the anode and the substrate.

8. The electro-luminescent display device according to claim 7, wherein the electro-luminescent display device is of a bottom emission type that emits light toward the color filters below.

9. The electro-luminescent display device according to claim 1, wherein the end portion of the first organic layer is spaced apart from the dummy pattern by a first distance and the end portion of the first cathode is spaced apart from the dummy pattern by a second distance longer than the first distance.

10. An electro-luminescent display device, comprising:
a substrate having an emission area and a non-emission area;
a thin film transistor disposed on the substrate in the non-emission area;
an anode disposed on an insulating layer that is disposed over the substrate and connecting the thin film transistor;
a bank having an opening that exposes a portion of the anode and having an undercut structure adjacent to the opening in the emission area, wherein the bank is spaced apart from an adjacent bank;
a dummy pattern disposed at the undercut structure of the bank;
an organic layer disposed on the anode and the bank,
wherein the organic layer includes a first organic layer disposed on the anode in the emission area and having an end portion spaced apart from the dummy pattern and a second organic layer disposed on the bank in the non-emission area and extending into a region between the spaced adjacent banks to contact the insulating layer,
an organic light emitting device including the organic layer and having a multi-stack structure to emit white light including a first stack having a first emission layer, a second stack having a second emission layer and a charge generation layer between the first stack and the second stack,
wherein the organic layer is electrically disconnected with adjacent pixels and movement of lithium doped in the charge generation layer of the organic layer to the adjacent pixels is suppressed;
first to third color filters disposed between the anode and the substrate, wherein edges of the first and second color filters overlap with the dummy pattern; and
a cathode disposed on the organic layer,
wherein the cathode includes a first cathode disposed on the first organic layer in the emission area and having an end portion spaced apart from the dummy pattern and a second cathode disposed on the second organic layer above the bank in the non-emission area, and
wherein at least a portion of the first cathode is connected to the second cathode.

11. The electro-luminescent display device according to claim 10, wherein the organic layer is electrically disconnected with at least one of adjacent pixels at a lateral surface of an edge of the opening of the bank.

12. The electro-luminescent display device according to claim 10, wherein the dummy pattern includes a metal material which is selectively etched relative to the anode.

13. The electro-luminescent display device according to claim 12, wherein the anode includes ITO, IZO, ZnO, or In2O3, and the dummy pattern includes Cu, Al, or IGZO.

14. The electro-luminescent display device according to claim 10, wherein the dummy pattern is disposed along at least three edges of the opening of the bank.

15. The electro-luminescent display device according to claim 14, wherein the dummy pattern is disposed along an entire edge of the opening of the bank.

16. The electro-luminescent display device according to claim 10, further comprising:
   color filters overlapping each other where the color filters correspond to an edge region of the opening and are disposed between the anode and the substrate.

17. The electro-luminescent display device according to claim 16, wherein the electro-luminescent display device is of a bottom emission type that emits light toward the color filters below.

18. The electro-luminescent display device according to claim 10, wherein the end portion of the first organic layer is spaced apart from the dummy pattern by a first distance and the end portion of the first cathode is spaced apart from the dummy pattern by a second distance longer than the first distance.

* * * * *